United States Patent [19]

Bowers

[11] Patent Number: 4,675,561
[45] Date of Patent: Jun. 23, 1987

[54] FET OUTPUT DRIVE CIRCUIT WITH PARASITIC TRANSISTOR INHIBITION

[75] Inventor: Derek F. Bowers, Sunnyvale, Calif.

[73] Assignee: Precision Monolithics, Inc., Santa Clara, Calif.

[21] Appl. No.: 798,430

[22] Filed: Nov. 15, 1985

[51] Int. Cl.[4] .......................................... H03K 17/12
[52] U.S. Cl. ................................ 307/570; 307/200 B;
307/446; 307/495; 307/362; 307/270; 307/585;
307/303; 307/304; 357/43
[58] Field of Search ................... 307/200 B, 446, 450,
307/451, 495, 362, 570, 584, 585, 270, 303, 304;
357/43, 41

[56] References Cited

U.S. PATENT DOCUMENTS

| | | | |
|---|---|---|---|
| 4,072,868 | 2/1978 | De La Moneda et al. | 307/450 |
| 4,288,804 | 9/1981 | Kikuchi et al. | 357/41 X |
| 4,449,224 | 5/1984 | Harari | 307/446 X |
| 4,513,309 | 4/1985 | Cricchi | 357/41 X |
| 4,605,872 | 8/1986 | Rung | 307/446 X |

Primary Examiner—Stanley D. Miller
Assistant Examiner—D. R. Hudspeth
Attorney, Agent, or Firm—Koppel & Harris

[57] ABSTRACT

A CMOS output drive circuit has two field effect transistors (FETs) implemented with a CMOS process and characterized by parasitic bipolar transistors. The backgates of the two transistors are tied together, such as by forming the devices in a common well, and the backgate of the second FET is also connected to prevent its associated parasitic bipolar transistor from conducting. Quiescent loads are applied to the two FETs so that their voltages are comparable during low output loading, resulting in a drive circuit with high input impedance and high output voltage swing. The output terminal is taken from the first FET, the voltage of which becomes unbalanced from the second FET at relatively high output loads, turning on the parasitic bipolar transistor for the first FET. This gives the drive circuit a desirably high input impedance and low output impedance for heavy output loads. The circuit thus sacrifices low output impedance for high input impedance and voltage swing during light output loading when output impedance is not very important, and sacrifices high voltage swing for high input impedance and low output impedance at heavy loads at which the impedance levels are more important than voltage swing.

13 Claims, 9 Drawing Figures

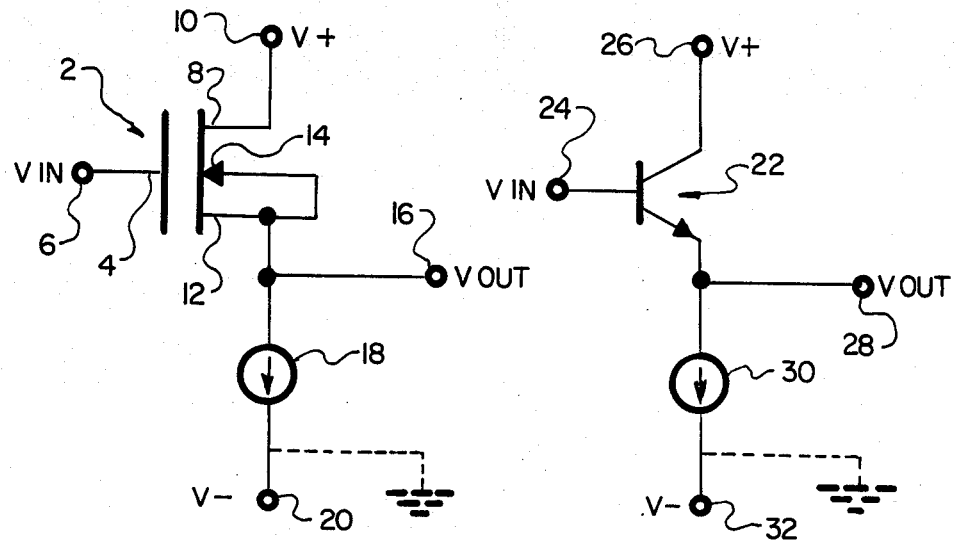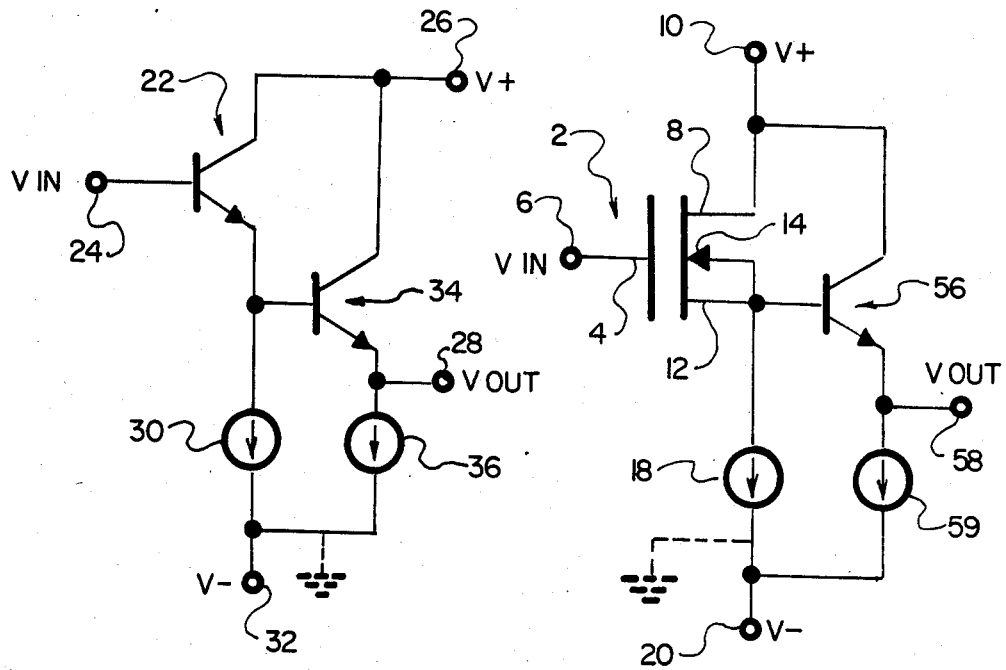
Fig.1. (PRIOR ART)
Fig.2. (PRIOR ART)
Fig.3. (PRIOR ART)
Fig.5. (PRIOR ART)

FET OUTPUT DRIVE CIRCUIT WITH PARASITIC TRANSISTOR INHIBITION

BACKGROUND OF THE INVENTION

1. Field of the Invention

This invention relates to output drive circuits, and more particularly to such circuits which are fabricated with a CMOS process and use field effect transistors characterized by associated parasitic bipolar transistors.

2. Description of the Prior Art

It is desirable that an output drive circuit have a very high input impedance and a low output impedance. It is also desirable that the circuit be characterized by a high "swing", which is a measure of how close the output voltage comes to the voltage level at the positive supply bus.

FIG. 1 shows a basic type of prior art output drive circuit implemented with a field effect transistor (FET) formed with a CMOS (complementary metal oxide semiconductor) process. The FET 2 includes a gate 4 that is connected to an input voltage terminal 6, a drain 8 connected to a positive voltage bus 10, and a source 12 and back-gate 14 connected in common to an output voltage terminal 16. A current source 18 draws current from the common source/back-gate connection and delivers current to a negative voltage bus or ground terminal 20. As shown, FET 2 is an n-channel output follower, with the back-gate 14 provided by a p-well on an n-type substrate. The circuit has the advantage of an almost infinite input impedance, but it also has a relatively high output impedance. The high output impedance is a distince disadvantage when driving relatively heavy loads at the output terminal.

Another type of prior art output drive circuit is shown in FIG. 2. This circuit consists of an npn bipolar transistor 22 having its base connected to an input voltage terminal 24, its collector connected to a positive voltage bus 26, and its emitter connected to an output load terminal 28. A current source 30 draws current from the emitter to a negative voltage bus or ground terminal 32.

The circuit of FIG. 2, known as an emitter follower, is characterized by a relatively low input impedance approximately equal to the product of the transistor current gain multiplied by the load resistance. Its input impedance can be increased by a factor approximately equal to the transistor current gain by means of a "Darlington" connection illustrated in FIG. 3. In this circuit a second bipolar transistor 34 has its base connected to the emitter of the first transistor 22, its collector connected in common with the collector of the first transistor, and a current source 36 drawing current from its emitter to the negative voltage bus or ground terminal 32. The output load terminal 28 is connected to the emitter of the second transistor 34. Unfortunately, even the improved input impedance offered by the Darlington circuit is too low for many applications.

Another approach that can be taken to provide an output drive circuit with high input impedance but low output impedance involves a standard p-well CMOS process to fabricate the circuit devices. It is known that, under certain conditions, an FET fabricated with a CMOS process can operate in a manner similar to a bipolar transistor; the device is described as having a "parasitic" bipolar transistor. This penomenon is illustrated in FIG. 4. The FET illustrated is fabricated on an n-type substrate 40 which is maintained at the voltage level of a positive voltage bus. A well 42 of p-type material is set into the substrate, with the FET formed in the well. Two n+ regions are diffused into the well, the first n+ implant 44 comprising the FET source and the other n+ implant 46 comprising its drain. Between the two n+ implants the surface of the well is oxidized to form an insulator strip 48, typically $SiO_2$ about 1,000–2,000 angstroms thick. A gate electrode 50 is then deposited on the insulator strip. If the p-well is heavily doped a surface inversion layer will normally not be present, and the FET will be off since there will be only a small leakage current between the source and drain. When a positive voltage is applied to the gate, a negative charge concentration is induced under the oxide layer 48 on the surface of the well. This induced negative charge consists of a combination of ionized acceptor impurities and free elecrons, producing a surface layer on the well which is now n-type. Such a layer on a p-type material is referred to as an inversion layer. When this induced n-type layer bridges the space between the source and drain implants, it forms a conducting channel containing free electrons. In the operation of the FET the p-well functions as its back-gate.

A parasitic bipolar transistor 52 associated with the described FET is shown in dashed lines. It can be seen that, in travelling down from the n+ source implant 44 through the P-well 42 to the N-substrate 40, an npn section is traversed. Under appropriate conditions these elements function as an npn bipolar transistor. The transistor's emitter is formed by the n+ source implant 44, its base by the p-well 42 (accessed through a p+ implant 54), and its collector by the n-substrate 40 which is maintained at V+.

A circuit has previously been devised which makes use of this parasitic bipolar transistor to achieve an output drive circuit with high input and low output impedances. This circuit, shown in FIG. 5, includes an FET which is similar to that shown in FIG. 1 and labeled with corresponding reference numerals. The back-gate 14 (p-well) is connected to the FET's source 12 to prevent the associated parasitic bipolar transistor from turning on and conducting; the back-gate can also be connected to the V− voltage bus for the same purpose. The FET source 12 is connected to the base of a separate bipolar transistor 56 which has its collector connected to V+ terminal 10 and its emitter connected to the circuit's output terminal 58. A second current source 59 draws current through the emitter to the V− or ground terminal 20. This circuit has been found to have both the high input impedance of the FIG. 1 circuit and the low output impedance of the FIG. 3 circuit. However, even in a best case implementation, its output voltage swing is limited in the positive direction to the sum of an NMOS FET threshold voltage ($V_T$) and a bipolar base-emitter voltage ($V_{BE}$) from the V+ supply voltage. This swing is worse than that exhibited by either the FIG. 1 or FIG. 3 circuits, and makes the circuit unsuitable for certain applications.

SUMMARY OF THE INVENTION

In view of the above problems associated with the prior art, the object of the present invention is to provide a novel and improved CMOS implemented output drive circuit having a better combination of high input impedance, low output impedance and high voltage swing than has been attainable in the past.

Another object is the provision of such an output drive circuit which can be implemented with a standard CMOS process that requires the addition of few or no extra devices.

These and other objects are achieved by means of a unique CMOS output drive circuit in which a pair of FETs are implemented by a CMOS process and coupled together to establish generally balanced FET voltage levels at relatively low output loads, with an output terminal connected to the first FET. Means are provided to inhibit conduction of a parasitic bipolar transistor associated with the second FET; conduction of the parasitic bipolar transistor associated with the first FET is also inhibited for low output loads due to the coupling between the two FETs. This results in relatively high input and output impedances and a high voltage swing for the first FET. The FET coupling is overridden at relatively high output loads, permitting conduction of the first FET's parasitic bipolar transistor and thereby reducing the FET's output impedance to a desirably low level. Since high output impedance is a disadvantage for high output loads but is relatively unimportant for light loads, the circuit achieves all of the disired input/output impedance and voltage swing characteristics under the operating conditions at which these characeristics are important.

In a preferred embodiment, conduction of the parasitic bipolar transistor for the second FET is inhibited by connecting its back-gate to its source, while the two FETs are coupled by connecting their back-gates together. This latter feature is conveniently accomplished by fabricating both FETs in the same well. Currents are drawn through the two FETs by respective quiescent load circuits in the form of current sources, the FETs and current sources being scaled so as to establish generally balanced FET voltages at low output load levels. Since the parasitic bipolar transistor for the second FET is rendered non-conductive, the coupling between the two FETs renders the parasitic bipolar transistor for the first FET likewise non-conductive at low output loads. The first FET, from which the drive circuit's output is taken, thus behaves in a manner similar to the basic FET drive circuit of FIG. 1 for low loads. For higher output loads, however, the output current outweighs the current source for the first FET and causes the first FET voltage to fall relative to the second FET voltage. At a sufficiently high output load the drop in the first FET voltage makes its associated parasitic bipolar transistor become conductive, in effect causing the circuit to behave in a manner similar to the FIG. 5 circuit at relatively high output loads. Since limited voltage swing is not a particular problem for high output loads but low output impedance is, the circuit under heavy loading has very desirable operating charactristics. In essence, the described output drive circuit sacrifices low output impedance for high input impedance and voltage swing during light output loading when output impedance is not very important, and sacrifices high output swing for high input impedance and low output impedance at heavy loads at which the impedance levels are more important that voltage swing. This is a uniquely advantageous mode of operation that has not been previously attained.

Further objects and features of the invention will become apparent to those skilled in the art from the following detailed description of preferred embodiments, taken together with the accompanying drawings, in which:

DESCRIPTION OF THE DRAWINGS

FIGS. 1, 2, 3 and 5 are schematic diagrams of prior art output drive circuits, described above;

DETAILED DESCRIPTION OF PREFERRED EMBODIMENTS

Figure 4:
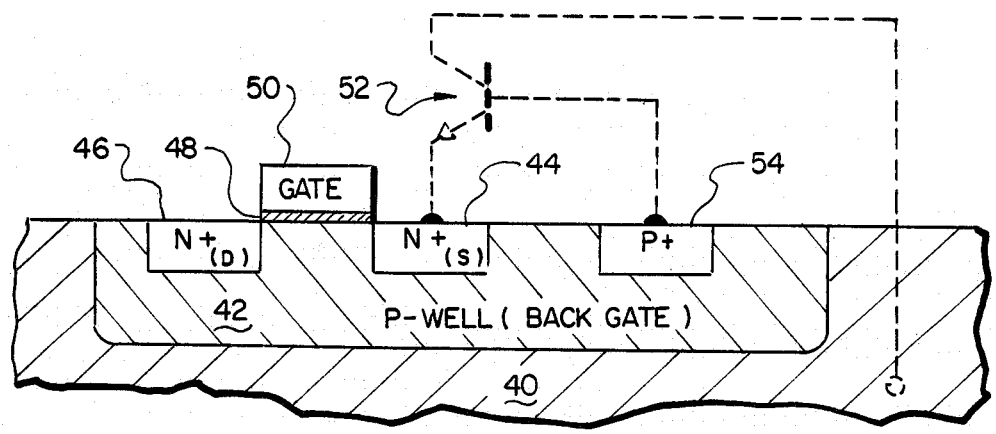
FIG. 4 is a cross-sectional view of a conventional FET implemented with CMOS technology, illustrating an associated parasitic bipolar transistor, and described above.
Figure 6:
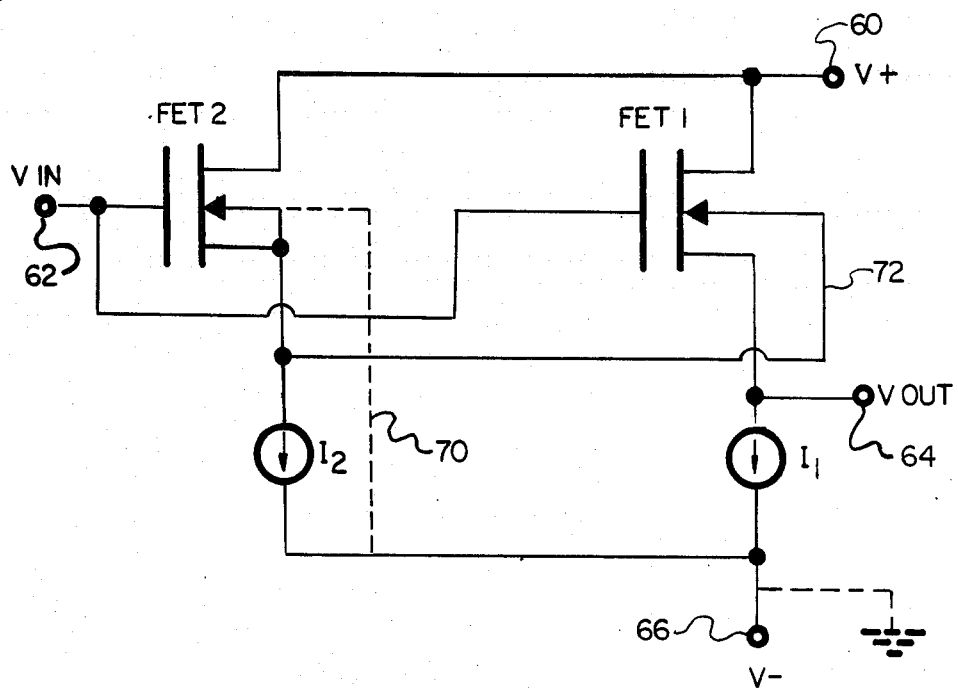
FIG. 6 is a schematic diagram showing a preferred embodiment of the present invention.

A schematic diagram of a basic output drive circuit utilizing the present invention is shown in FIG. 6. A pair of NMOS FETs FET 1 and FET 2 are formed on a substrate with their drains connected to a positive voltage terminal 60. An input voltage terminal 62 is connected to the gate of each FET. The FET 1 source is connected to a output voltage terminal 64 and also to a current source I1, which drives a quiescent load current from the source to a V− or ground terminal 66. The FET 2 source is connected to its own quiescent load circuit in the form of a current soruce I2, which drives current from the FET 2 source to V− or ground terminal 66. The back-gate of FET 2 is connected to its source or, as indicated by dashed line 70, to V− terminal 66. Either connection for the FET 2 back-gate will prevent its associated parasitic bipolar transistor from becoming conductive. The back-gates of FET 1 and FET 2 are coupled together, as indicated by connecting line 72, maintaining the back-gates of both FETs at the same voltage level.

The scaling of the two FETs and of their associated current sources I1 and I2 are selected to establish similar current densities in the two FETs for low output loads. I1 and I2 may typically be 20 $\mu$A each, but in general can range from 1–100 $\mu$A or more. The current sources will be relatively high for high speed circuits, and relatively less for low power circuits. I1 can be scaled considerably differently from I2 if the FETs are similarly scaled so as to produce comparable current densities and source voltages for the two FETs at low output load levels. For example, if the I1 current is ten times the I2 current, FET 1 would be scaled about ten times larger than FET 2, resulting in balanced voltages at the two FET sources.

At relatively light output loads the output voltage at terminal 64 is determined primarily by the FET 1 voltage drop induced by I1. Since the FET 1 back-gate voltage is tied to the FET 2 back-gate voltage and the current densities in both FETs are comparable, the source voltage of FET 1 will generally track the source voltage of FET 2. Thus, since the back-gate of FET 2 is connected to inhibit conduction of its parasitic bipolar transistor, conduction of the parasitic bipolar transistor for FET 1 will similarly be inhibited during light output loads.

As the output terminal 64 is progressively loaded, significantly more current will flow through FET 1 than through FET 2. This causes the FET 1 source voltage to fall relative to the FET 2 source voltage. As the load continues to increase the parasitic bipolar transistor for FET 1 is eventually turned on.

Figure 7:
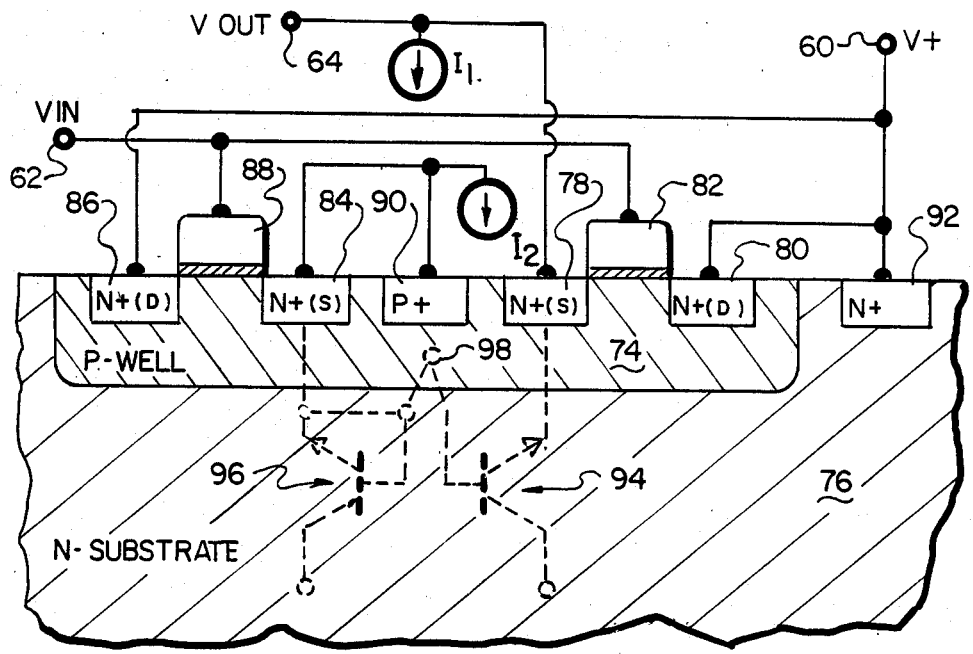
FIG. 7 is a cross-sectional view of an implementation of the FIG. 6 circuit on a semiconductor substrate.

The physical construction of the FIG. 6 circuit is illustrated in FIG. 7. The circuit devices are formed in a p-well 74 which in turn is set in an n-substrate 76. The source and drain of FET 1 comprise n+ implants 78 and 80, respectively, separated by an insulated gate 82. FET 2 is formed on the other side of the p-well by source and drain n+ implants 84 and 86, respectively, separated by an insulated gate 88. Contact with the p-well is made through a p+ implant 90. V+ from supply terminal 60 is applied to each of the drains, and to the substrate 76 through n+ implant 92.

As shown, I1 is connected to draw current from FET 1 source implant 78, while I2 is connected to draw current from FET 2 source implant 84. FET 2 source 84 is also connected to the p-well through contact implant 90, thus tying it together with the FET 2 back-gate.

The parasitic bipolar transistors associated with FET 1 and FET 2 are indicated in dashed lines by transistors 94 and 96, respectively. Since FET 1 and FET 2 are fabricated in a common p-well, their back-gates are intrinsically tied together, establishing a common base 98 for the two parasitic bipolar transistors. The base and emitter of bipolar transistor 96 are shown connected together, reflecting the connection between FET 2 source implant 84 and the p-well through contact implant 90. Tying the base and emitter of npn parasitic bipolar transistor 96 together in this fashion causes the p-well to be reverse biased and prevents the bipolar transistor from becoming conductive. With FET 1 and FET 2 operating at similar current densities at low output loads, the common back-gate (bipolar base) for the two devices keeps the FET 1 p-well reverse biased. When the FET 1 source voltage has fallen by one $V_{BE}$ (approximately 0.5–0.6 volts), the back-gate p-well starts to forward bias to the source. This turns on the parasitic bipolar transistor for FET 1, causing FET 1 to behave as a bipolar transistor with its superior operating characteristics for high output loads.

While the invention thus far has been described in terms of a particular polarity scheme with an n-substrate, p-well and npn parasitic bipolar transistors, it is equally applicable to the opposite polarity arrangement with a p-substrate, n-well and pnp parasitic bipolar transistors. Complementary circuit connections would be made with such a reversal of polarity.

Figure 8:
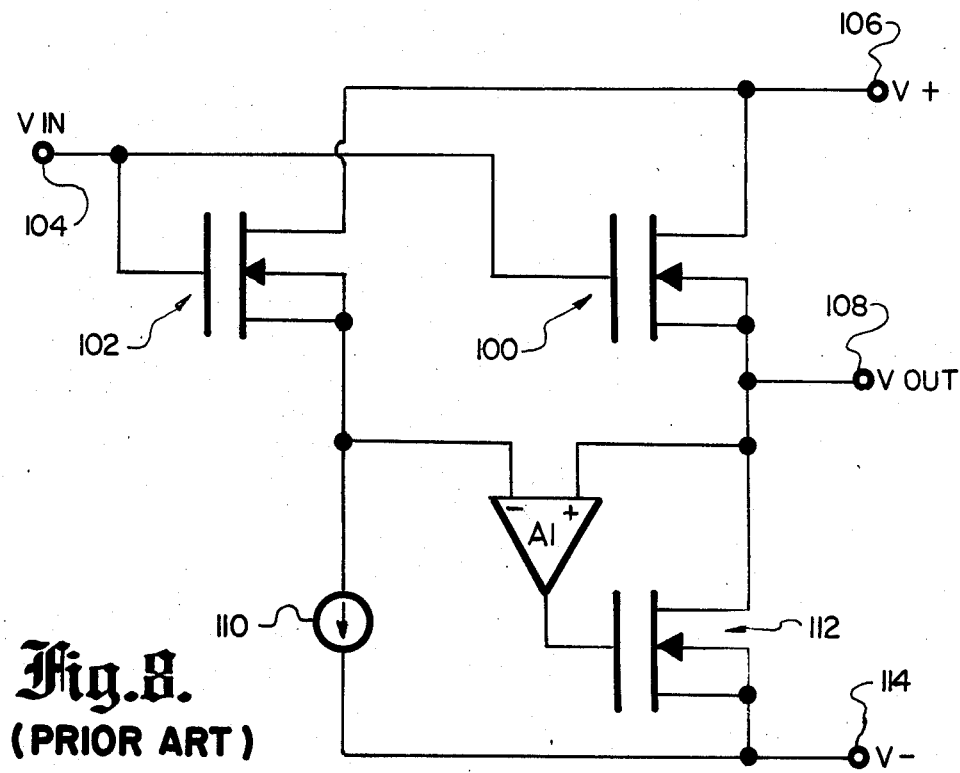
FIG. 8 is a schematic diagram of a prior art amplifier circuit.

The output drive circuit of FIG. 6 appears to require an extra device (one FET) as compared with the basic prior art drive circuit of FIG. 1. While this may be true in certain applications, in most cases the devices necessary to implement the invention are already available. For example, FIG. 8 is a schematic diagram of an output circuit which is commonly used for CMOS amplifiers. The circuit consists of a pair of FETs 100 and 102, each having its gate connected to an input voltage terminal 104, its drain connected to a positive voltage supply bus 106, and its source connected in common with its back-gate. The source of FET 100 is connected to an output terminal 108 and the non-inverting input of an operational amplifier A1, while the source of FET 102 is connected to a current source 110 and to the non-inverting input of A1. A third FET 112 is provided with its drain connected to the source of FET 100, its gate connected to the output of A1, and its source and back-gate connected in common to negative voltage terminal 114.

The described circuit is designed to both sink and source substantial amounts of current. When sinking current, FET 100 starts to turn off and its gate-source voltage decreases. A1 senses this and turns on FET 112 in an attempt to keep its inputs at the same potential. With FETs 100 and 102 of similar size, turning on FET 112 brings the current in FET 100 to a level approximately equal to the source 110 current, which is, the desired outcome. When sourcing current, the gate-source voltage of FET 100 increases. The output of A1 now tends toward V−, turning off FET 112 completely. At this point FET 100 is left to do the job of sourcing current, which it performs no better or worse than the prior art circuit of FIG. 1.

Figure 9:
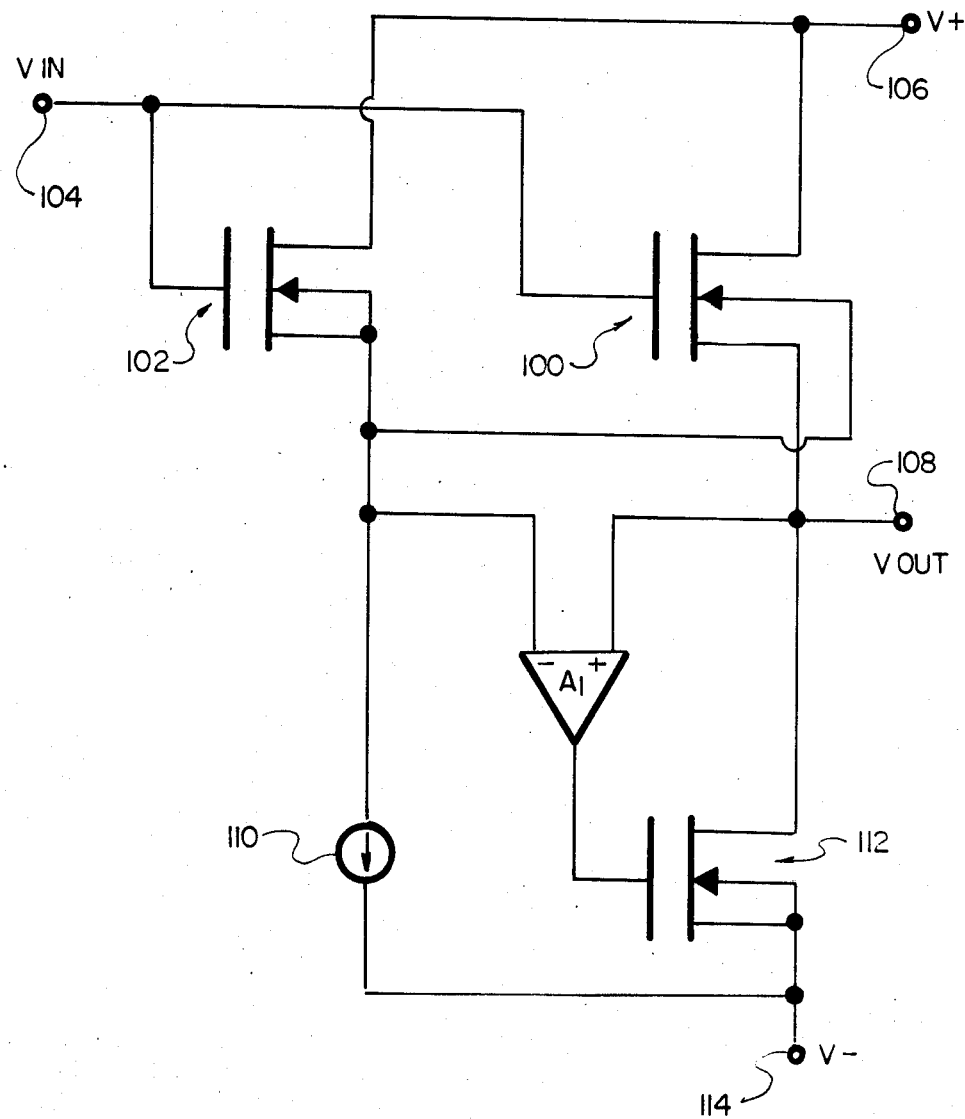
FIG. 9 is a schematic diagram of the FIG. 8 amplifier circuit as modified to achieve the benefits of the present invention.

The application of the present invention to the FIG. 8 circuit is shown in FIG. 9. The circuit is the same, with the exception that the back-gate of FET 100 has been de-coupled from its source and is now connected to the back-gate of FET 102. This causes the FIG. 9 circuit, when sinking current, to exhibit substantially identical characteristics as the prior art FIG. 8 circuit. However, when sourcing current it has the advantageous characteristics of the FIG. 6 circuit encompassed by the present invention.

Various embodiments of the invention have thus been shown and described. As numerous modifications and alternate embodiments may occur to those skilled in the art, it is intended that the invention be limited only in terms of the appended claims.

I claim:

1. An output drive circuit, comprising:

first and second field effect transistors (FETs), each FET formed in a well of doped semiconductor material which is set in an integrated circuit substrate of oppositely doped semiconductor material and characterized by respective parasitic bipolar transistors, an input terminal connected in common to the first and second FETs, an output terminal connected to the first FET, a positive voltage bus connected to the drains of the first and second FETs, means inhibiting conduction of the parasitic bipolar transistor for the second FET, means coupling the first and second FETs to establish a source voltage level for the first FET at relatively low output terminal loads which inhibits conduction of the parasitic bipolar transistor for the first FET, with resulting relatively high input and output impedances and a high voltage swing approaching the positive bus voltage for the first FET, the coupling means permitting conduction of the parasitic bipolar transistor for the first FET at relatively high output terminal loads with an accompanying decrease in output impedance, and current source means directing current through the two FETs, the current value of the current source means being scaled relative to the FET area scalings to maintain the source voltages of the two FETs sufficiently close together at low output terminal loads to sustain the inhibition of conduction for the first FET's parasitic bipolar transistor.

2. The output drive circuit of claim 1, wherein the means inhibiting conduction of the parasitic bipolar transistor for the second FET comprises means connecting the second FET's back-gate to its source.

3. The output drive circuit of claim 1, wherein the means coupling the first and second FETs comprises means coupling the back-gates of the two FETs to maintain the FET voltages at comparable levels for low output terminal loads.

4. The output drive circuit of claim 3, the first and second FETs being fabricated in a common well of doped semiconductor material which provides back-gate coupling between the two FETs.

5. The output drive circuit of claim 1, the FET sources and drain being coupled in common to respective voltages buses, the current source means comprising first and second current sources connected respectively to the source-drain circuits of the first and second FETs, and the FETs and current sources being scaled in size to establish approximately equal current density values in the two FETs at relatively low output terminal loads.

6. The output drive circuit of claim 5, wherein the two FETs are substantially equal in size, and the two current sources are substantially equal in current value.

7. An output drive circuit, comprising:
a first field effect transistor (FET) formed in a well of doped semiconductor material which is set in an integrated circuit substrate of oppositely doped semiconductor material and characterized by a parasitic bipolar transistor,
an output terminal connected to the source-drain circuit of the first FET,
a second FET formed in a well of doped semiconductor material which is set in the integrated circuit substrate and characterized by a parasitic bipolar transistor,
a positive voltage bus connected to the drains of the first and second FETs,
means inhibiting conduction of the parasitic bipolar transistor for the second FET,
an input terminal connected in common to the gates of the first and second FETs,
first and second current sources connected to drive respective currents through the drain-source current paths of the first and second FETs, respectively, and
the second FET being coupled to the first FET and the current values of the current sources being selected to limit the FET source voltages to levels which inhibit conduction of the parasitic bipolar transistor associated with the first FET during relatively low output terminal loads, thereby establishing relatively high input and output impedances and a high voltage swing approaching the positive bus voltage for the first FET, the current sources permitting the parasitic bipolar transistor for the first FET to become conductive at relatively high output terminal loads with an accompanying decrease in output impedance.

8. The output drive circuit of claim 7, wherein the block-gate of the second FET is coupled to the back-gate of the first FET to maintain the FET voltages at comparable levels for low output terminal loads.

9. The output drive circuit of claim 7, wherein the first and second FETs are of similar size and the first and second current sources provide similar quiescent loads to the first and second FETs.

10. An output drive circuit, comprising:
a positive voltage bus,
first and second field effect transistors (FETs), each FET formed in a well of semiconductor material which is set in an integrated circuit substrate of oppositely doped semiconductor material and characterized by respective parasitic bipolar transistors and a common back-gate connection, the FET drains being connected to the positive voltage bus,
an output terminal connected to the first FET,
an input terminal connected to the FETs,
means connecting the base of the parasitic bipolar transistor for the second FET with its collector-emitter circuit to prevent it from becoming conductive, and
first and second current sources connected respectively to provide on the source-drain current paths of the first and second FETs, the FET area scalings and current values of the current sources being approximately balanced to limit the FET source voltages to levels which hold the parasitic bipolar transistor for the first FET in a non-conductive state for relatively low output terminal loads under the influence of its common back-base connection with the second FET, and thereby establishing relatively high input and output impedances and a high voltage swing approaching the positive bus voltage for the first FET, the current sources being small enough in current value so that the parasitic bipolar transistor for the first FET becomes conductive at relatively high output terminal loads with an accompanying decrease in output impedance.

11. The output drive circuit of claim 10, said FETs being formed in a well of one conductivity with source and drain implants of opposite conductivity, said means connecting the base of the parasitic bipolar transistor for the second FET with its collector-emitter circuit comprising a connection between the second FET source and the well.

12. The output drive circuit of claim 10, the FETs and their respective current sources being scaled to establish approximately balanced current densities in the two FETs at relatively low output terminal loads.

13. An output drive circuit, comprising:
an integrated circuit semiconductor substrate of a first conductivity type,
a device well formed in the substrate of a second conductivity type opposite to the substrate's conductivity type,
first and second field effect transistors (FETs) comprising respective spaced pairs of first doped regions in the well providing sources and drains, and respective gates between the source and drain regions, the FETs being characterized by respective parasitic bipolar transistor,
an input terminal connected in common to the first and second FETs,
a positive voltage bus connected to the drains of the first and second FETs,
an output terminal connected to the first FET, and
first and second current sources connected to establish current flows through the source-drain current path for the first and second FETs, respectively, the current values of the first and second current sources being scaled relative to the first and second FETs to maintain the soruce voltages of the first and second FETs sufficiently close together during low output terminal loads to inhibit conduction of the first FET's parasitic bipolar transistor, with resulting relatively high input and output impedances and a high voltage swing approaching the positive bus voltage for the first FET, the current sources being small enough in current value to permit the parasitic bipolar transistor for the first FET to become conductive at relatively high output terminal loads with an accompanying decrease in output impedance.

* * * * *